United States Patent

Saitoh et al.

[11] Patent Number: 5,972,726
[45] Date of Patent: *Oct. 26, 1999

[54] METHOD OF DETECTING CONCENTRATION OF CONTAMINATION ON A SEMICONDUCTOR WAFER

[75] Inventors: Yukio Saitoh, Hiratsuka; Shigenori Toshiyoshi, Miyazaki; Tokitsugu Zushi, Miyazaki; Takanori Nishimura, Miyazaki, all of Japan

[73] Assignee: Komatsu Electronic Metals Co., Ltd., Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/098,872

[22] Filed: Jun. 17, 1998

[30] Foreign Application Priority Data

Jun. 19, 1997 [JP] Japan ................................. 9-162213

[51] Int. Cl.⁶ ........................... H01L 21/66; G01R 31/26
[52] U.S. Cl. .................................. 438/14; 134/1.3; 134/34
[58] Field of Search .................................. 438/14, 15, 16, 438/17, 18; 348/126; 436/178; 134/1.3, 34

[56] References Cited

U.S. PATENT DOCUMENTS

| | | | |
|---|---|---|---|
| 4,591,890 | 5/1986 | Lund et al. | 257/398 |
| 4,634,497 | 1/1987 | Shimazaki | 438/694 |
| 4,990,459 | 2/1991 | Maeda et al. | 436/178 |

*Primary Examiner*—John F. Niebling
*Assistant Examiner*—John Murphy
*Attorney, Agent, or Firm*—Welsh & Katz, Ltd.

[57] ABSTRACT

An oxide film is formed of a silicon substrate, and then the oxide film is cleaned together with the silicon substrate. Afterwards, a medical fluid is dropped on the oxide film which has been cleaned, and then the oxide film is dissolved by the medical fluid to collect contaminants included in the oxide film.

7 Claims, 5 Drawing Sheets

METHOD OF DETECTING CONCENTRATION OF CONTAMINATION ON A SEMICONDUCTOR WAFER

BACKGROUND OF THE INVENTION

1. Field of the Invention

This invention relates to a method of detecting concentration of contamination on a semiconductor wafer, and especially relates to a method of detecting concentration of contamination on a semiconductor wafer which is effective to sensitively detect concentration of contamination on a semiconductor wafer.

2. Description of the Prior Art

The WSA (wafer surface analysis) method has been used as a method of detecting metal contamination such as Fe or Cu formed on a semiconductor wafer. The WSA method is carried out in a series of the following steps.

1) A hydrophobic surface is formed on a semiconductor wafer by dissolving a natural oxide film formed on the semiconductor wafer.
2) A medical fluid is dropped on the hydrophobic surface.
3) The medical fluid dropped on the hydrophobic surface is moved along the surface of the semiconductor wafer so that the medical fluid contains therein contaminants attached to the surface of the wafer.
4) The medical fluid which contains the contaminants is collected.
5) The medical fluid collected in the step 4 is analyzed with an analysis device to obtain the concentration of contamination.
6) The concentration of contamination on a product wafer is determined based on the concentration of contamination obtained in the step 5.

The concentration of contamination down to a level of $10^9$–$10^{10}$ (atoms/cm$^2$) can be detected according to the WSA method. However, to detect the contamination on a semiconductor wafer in the WSA method is gradually more difficult as contamination on semiconductor wafers which have been cleaned becomes lower with the improvement of the cleaning technology.

SUMMARY OF THE INVENTION

An object of this invention is to provide a method of detecting concentration of contamination on a semiconductor wafer which is effective to sensitively detect concentration of contamination on a semiconductor wafer.

To achieve the above object, this invention is created by paying attention to the aspect that metal contaminants are easily attached to an oxide film. That is, in this invention, an oxide film is formed on a silicon substrate, which is then cleaned, and the concentration of the contaminants included within the oxide film which has been cleaned is detected.

According to the above method, the concentration of contamination can be detected about 100 times as sensitive as in a silicon substrate on which an oxide film is not formed.

BRIEF DESCRIPTION OF THE DRAWINGS

The various features of novelty which characterize this invention are pointed out with particularity in the claims annexed to and forming a part of this specification. For a better understanding of this invention, its operating advantages, and specific objects attained by its use, reference should be had to the accompanying drawing and descriptive matter in which there is illustrated and described a preferred embodiment of this invention.

This invention disclosed herein will be understood better with reference to the following drawings of which.

DETAILED DESCRIPTION OF THE INVENTION (The First Mode)

Figure 1:
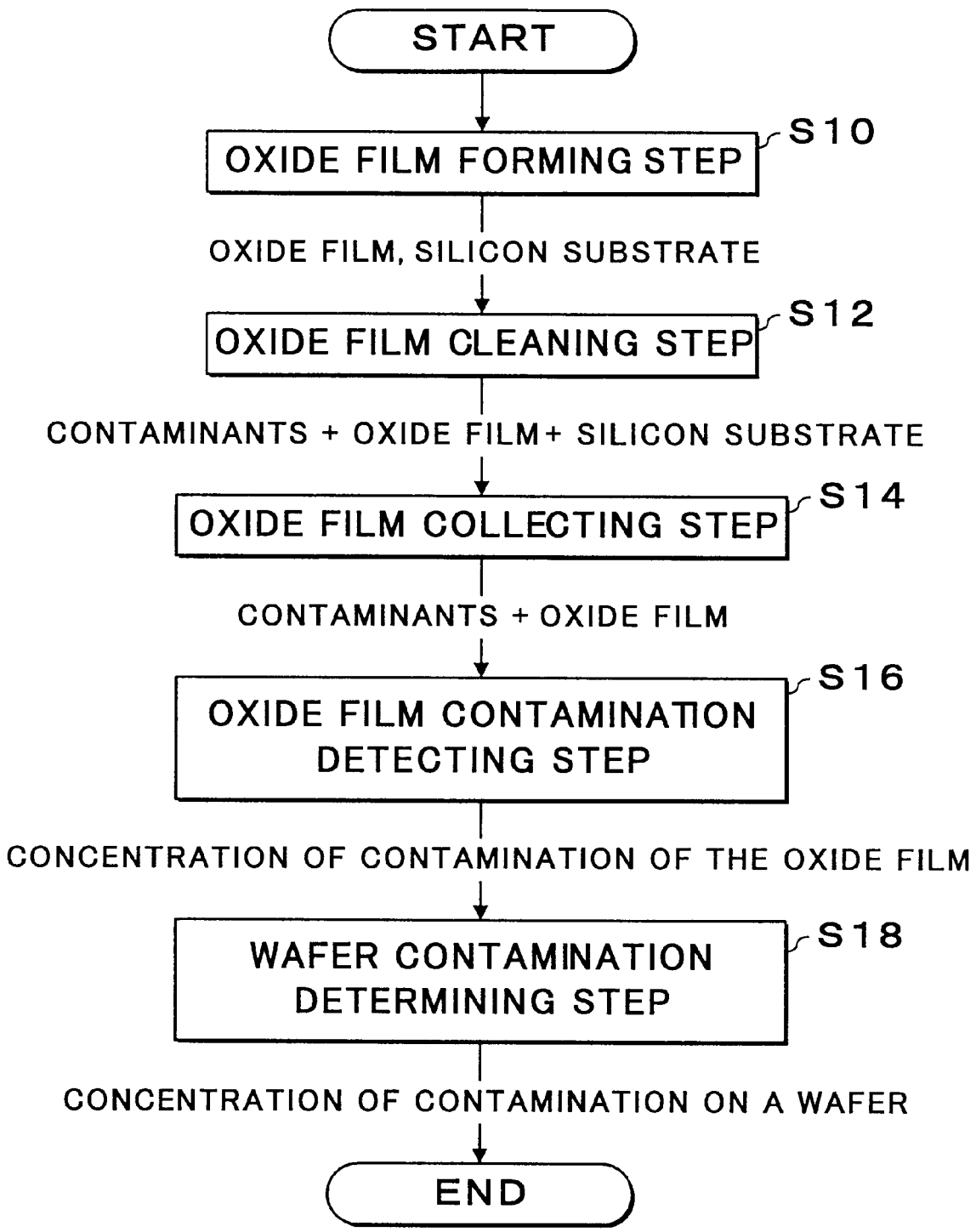
FIG. 1 is a process diagram which shows the execution procedure of the method of detecting concentration of contamination on a semiconductor wafer in accordance with the first mode of this invention.

FIG. 1 is a process diagram which shows the execution procedure of the method of detecting concentration of contamination on a semiconductor wafer in accordance with the first mode of this invention. Hereafter, a series of the steps shown in this figure is explained as follows.

An oxide film forming step S10 is a step in which an oxide film is formed on a silicon substrate. The reason for forming the oxide film on the silicon substrate is as follows. That is, an oxide film has the characteristic that the high enthalpy metal such as Fe and Al is easily attached thereto compared with silicon. Because of this characteristic of the oxide film, a larger amount of contaminants can attach to the oxide film than to a product wafer in the cleaning process.

It is desirable that the oxide film formed on the silicon substrate is a silicon oxide film such as silicon dioxide film. Such a silicon oxide film can be formed with CVD (Chemical Vapor Deposition) where silicon dioxide is deposited on the silicon substrate by the chemical reaction, or a heat oxidation method by which the silicon substrate is oxidized directly.

It is desirable that a substrate which has the same shape and contamination as the product wafer is used as the silicon substrate. Using such a substrate, the action in which the product wafer contaminates the cleaning solvent used in the cleaning machine and the action in which the cleaning solvent contaminates the product wafer are faithfully performed in the following steps.

The oxide film may be formed at least a part of the silicon substrate. For instance, it may be formed on the entire surface of the silicon substrate or one of the front and rear surfaces of the silicon substrate or even only in the edge part of the silicon substrate. Preferably, the oxide film is formed on the entire surface of the silicon substrate. If the oxide film is formed on the entire surface of the silicon substrate, the oxide film contaminated by the cleaning step can be easily collected.

An oxide film cleaning step S12 is a step in which the oxide film formed on the silicon substrate is cleaned. Alternatively, in this oxide film cleaning step S12, the oxide film formed on the silicon substrate may be collected from the substrate and then the collected oxide film is cleaned. Preferably, the oxide film formed on the silicon substrate is set into the cleaning machine without being collected, and then is cleaned together with the silicon substrate. This invention shall be understood in the broadest sense like this. The reason for cleaning the oxide film is explained as follows. It is thought that the metallic contamination is mainly caused in the cleaning step. That is, the metal contaminants included in the cleaning solvent are attached to the semiconductor wafer during the cleaning. The cause of including the metal contaminants in the cleaning solvent is thought as follows. For example, existing within the cleaning solvent before the cleaning, coming from the cleaning machine, or coming from cleaning a great number of wafers. Since in the oxide film cleaning step S12 the metal contaminants included in the cleaning solvent are attached to the oxide film, the oxide film cleaning step S12 is preferably performed with the same condition as an condition where the product wafer is treated.

An oxide film collecting step S14 is a step in which the oxide film where the contaminants are included by performing the oxide film cleaning step S12 is collected. In this oxide film collecting step S14, the oxide film formed on the silicon substrate is mechanically collected and then analyzed by an analyzer or is chemically collected by dissolving the oxide film in a solvent.

An oxide film contamination detecting step S16 is a step in which the concentration of the contaminants included in the oxide film which is collected in the oxide film collecting step S14 is detected. For example, the WSA method (wafer surface analysis), SIMS method (Secondary Ion Mass Spectroscopy), VPD-TXRF method (Vapor Phase Decomposition-Total Reflection X-Ray Fluorescence), SPV method (Surface Photo Voltage), and ICP-MS method (Inductively Coupled Plasma-Mass Spectrometry) have been known as methods of detecting the concentration of the contaminants. According to using the oxide film, a detection sensitivity which is about 100 times than that of the conventional analyzing technologies can be achieved because the oxide film to which the contaminants are easily attached is subjected to these conventional analyzing technologies. The concentration of contamination detected in the oxide film contamination detecting step S16 is a parameter which indicates a degree of contamination on a product wafer caused by the cleaning step. In other words, this invention evaluates the cleaning ability of the cleaning machine. Therefore, concentration of contamination on a product wafer cleaned by the cleaning machine evaluated by this invention can be determined.

A wafer contamination determining step S18 is a step in which concentration of contamination on the product wafer is determined. The concentration of contamination on a product wafer is determined based on the concentration of contamination in the oxide film detected in the oxide film contamination detecting step S16. The inventors who create this invention conducted the experiments many times, in a result from which the relation between the contamination in an oxide film and the contamination on silicon was derived. Although the result of these experiments is described later, according to the result of these experiments, it is found that an oxide film is contaminated about 100 times than silicon. Preferably, the various kinds of relations between the contamination in an oxide film and the contamination on silicon are obtained because such relations can vary according to the cleaning condition. The concentration of contamination in the oxide film is transformed into the concentration of contamination on the silicon. Specifically, the concentration of contamination on a product wafer is obtained by dividing the value detected in the oxide film contamination detecting step S16 by 100.

According to the first mode of this invention described above, the detection sensitivity can be improved because a larger amount of contaminants can be attached to the oxide film compared with the silicon in the cleaning step. Specifically, the detection sensitivity is improved about 100 times than in the conventional methods in which an oxide film is not used.

(The Second Mode)

Figure 2:
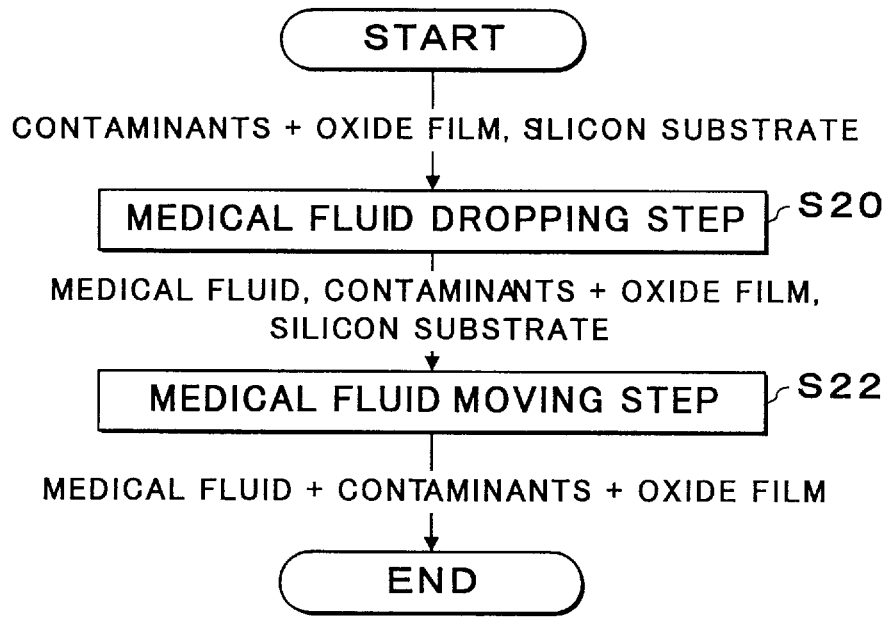
FIG. 2 is a process diagram which shows the execution procedure of the oxide film collecting step S14 in FIG. 1 in accordance with the second mode of this invention.

FIG. 2 is a process diagram which shows the execution procedure of the oxide film collecting step S14 in FIG. 1 in accordance with the second mode of this invention. The oxide film collecting step S14 of the second mode has a more preferable construction than that of the first mode. Each steps which construct the second mode is explained as follows.

A medical fluid dropping step S20 is a step in which a medical fluid is dropped on the oxide film which has been cleaned in the oxide film cleaning step S12. The medical fluid used in this step is a solvent which can dissolve the oxide film. Preferably, this medical fluid is selected from the group consisting of HF, $HF+HNO_3$, $HF+H_2O_2$ and $HCl+H_2O_2$. These solvents are suitable to collect the oxide film.

A medical fluid moving step S22 is a step in which the medical fluid dropped on the oxide film in the medical fluid dropping step S20 is moved on the oxide film. As a result of which, the contaminated oxide film can be taken in the medical fluid. That is, the contaminants which are attached to the oxide film by the cleaning can be collected.

According to the second mode of this invention explained above, it is possible to collect the contaminants which are attached to the oxide film efficiently because the contaminants together with the oxide film are taken in the medical fluid by dissolving therein.

(The Third Mode)

Figure 3:
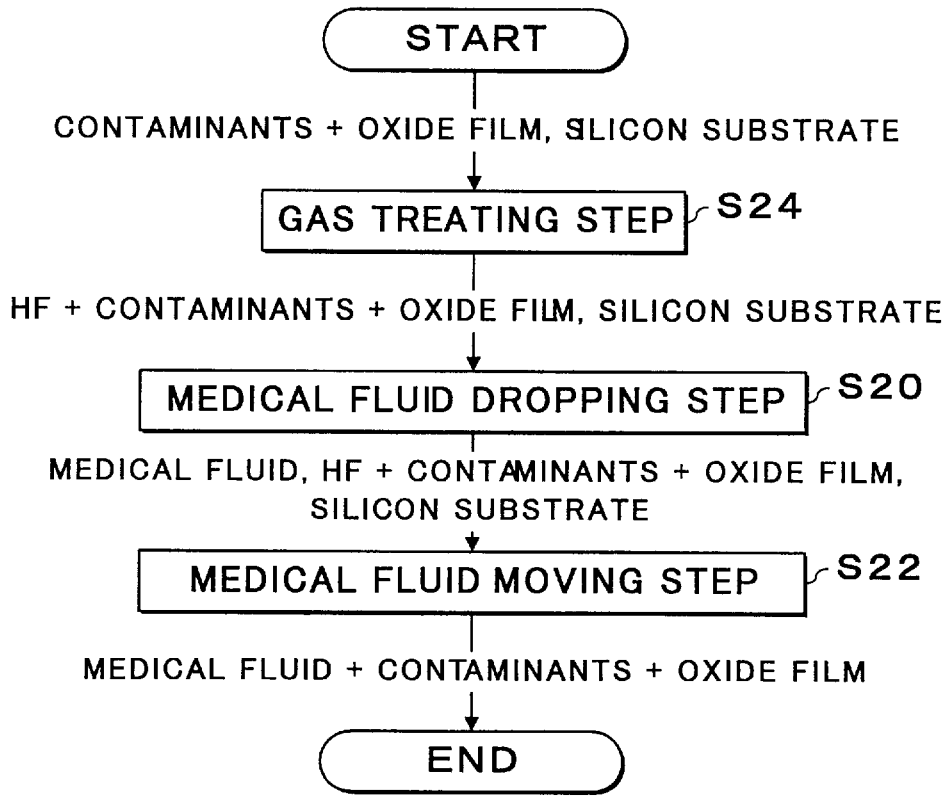
FIG. 3 is a process diagram which shows the execution procedure of the oxide film collecting step S14 in FIG. 1 in accordance with the third mode of this invention.

FIG. 3 is a process diagram which shows the execution procedure of the oxide film collecting step S14 in FIG. 1 in accordance with the third mode of this invention. The oxide film collecting step S14 of the third mode has a more preferable construction than that of the second mode. In this third mode, a gas treating step S24 is performed before the medical fluid dropping step S20 as shown in this figure.

The gas treating step S24 is a step in which the oxide film is let in fluorinated gas. When this step is performed to the oxide film, the upper layer of the oxide film which is let in the fluorinated gas is dissolved. When the medical fluid is dropped on such a dissolved layer, the oxide film is easily taken in the medical fluid. It is desirable to use hydrofluoric gas as the fluorinated gas.

According to the third mode of this invention described above, the oxide film is efficiently collected because the medical fluid is dropped in a state where the upper layer of the oxide film is dissolved.

DESCRIPTION OF THE PREFERRED EMBODIMENT

The preferred embodiment of this invention is performed in a series of the following steps.

1) A wafer whose rear surface is mirror polished (hereinafter referred to as "silicon substrate 12" in order to distinguish from a product wafer) is prepared.

Figure 4:
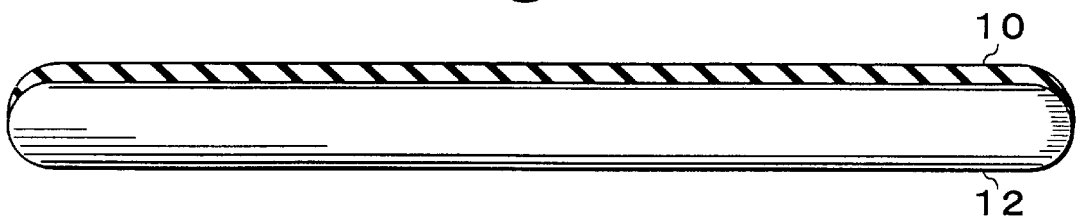
FIG. 4 is a side view which shows the structure of a silicon substrate having an oxide film.

2) The front surface of the prepared silicon substrate 12 is oxidized. FIG. 4 is a side view which shows the structure of a silicon substrate having an oxide film.

3) The oxidized silicon substrate 12 is put into a cleaning machine and is cleaned with alkali such as ammonia hydrogen peroxide solution for 30 minutes.

Figure 5:
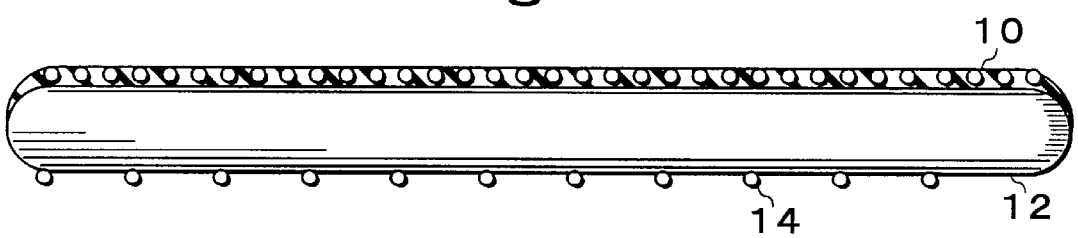
FIG. 5 is a side view which shows the state of the silicon substrate and the oxide film which have been cleaned.

4) The silicon substrate 12 which has been cleaned is exsiccating to obtain a contaminated silicon substrate 12. FIG. 5 is a side view which shows the state of the silicon substrate and the oxide film which have been cleaned. As shown in this figure, the contaminants 14 are attached to the rear surface of the silicon substrate 12 and the larger amount of the contaminants 14 are attached to the oxide film 10.

Figure 6:
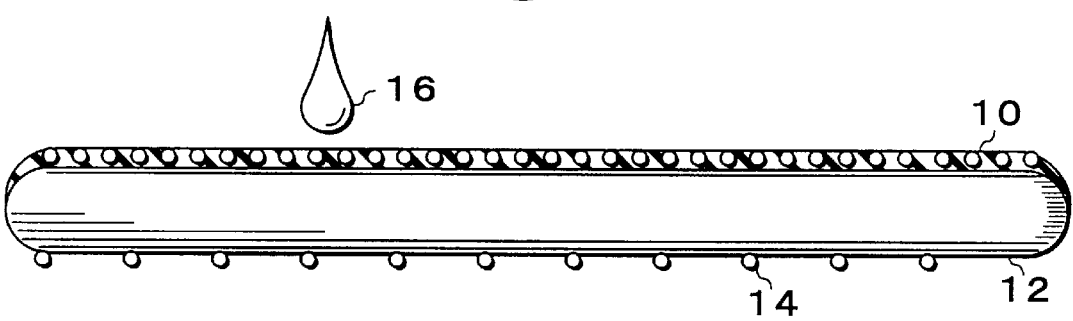
FIG. 6 is a side view which shows the state that a medical fluid drops onto the oxide film.

5) The medical fluid 16 which consists of hydrofluoric acid is dropped on the oxide film 10. FIG. 6 is a side view which shows the state that a medical fluid drops onto the oxide film.

Figure 7:
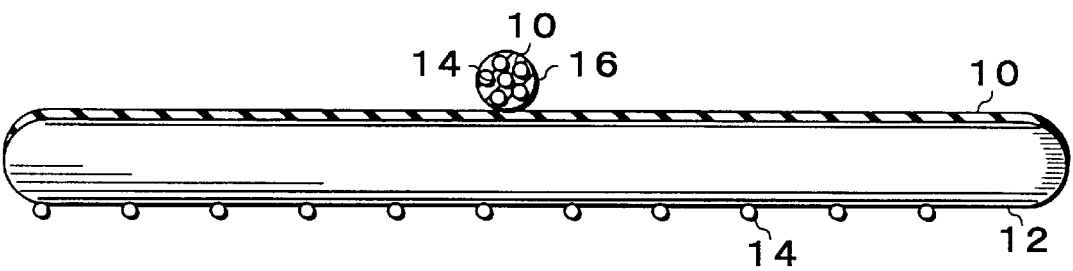
FIG. 7 is a side view which shows the state that the medical fluid is moved on the oxide film.

6) The medical fluid 16 is moved on the oxide film 10 to remove the upper layer of the oxide film 10 by a thickness of 100 Å. FIG. 7 is a side view which shows the state that the medical fluid is moved on the oxide film. As shown in this figure, the upper layer of the oxide film 10 and the contaminants 14 have been taken in the medical fluid 16 after performing the step 5.

7) The medical fluid 16 which includes the removed oxide film 10 and the contaminants 14 is analyzed by an atomic absorption analyzer to detect the concentration of contamination in the medical fluid.

8) The medical fluid which consists of hydrofluoric acid is dropped on the rear surface of the silicon substrate 12, and then the medical fluid is moved on the rear surface of the silicon substrate to collect the contaminants which are attached to the rear surface of the silicon substrate 12.

9) The medical fluid 16 which includes the contaminants collected from the rear surface of the silicon substrate 12 is analyzed by the atomic absorption analyzer to detect the concentration of contaminants of the medical fluid.

Figure 8:
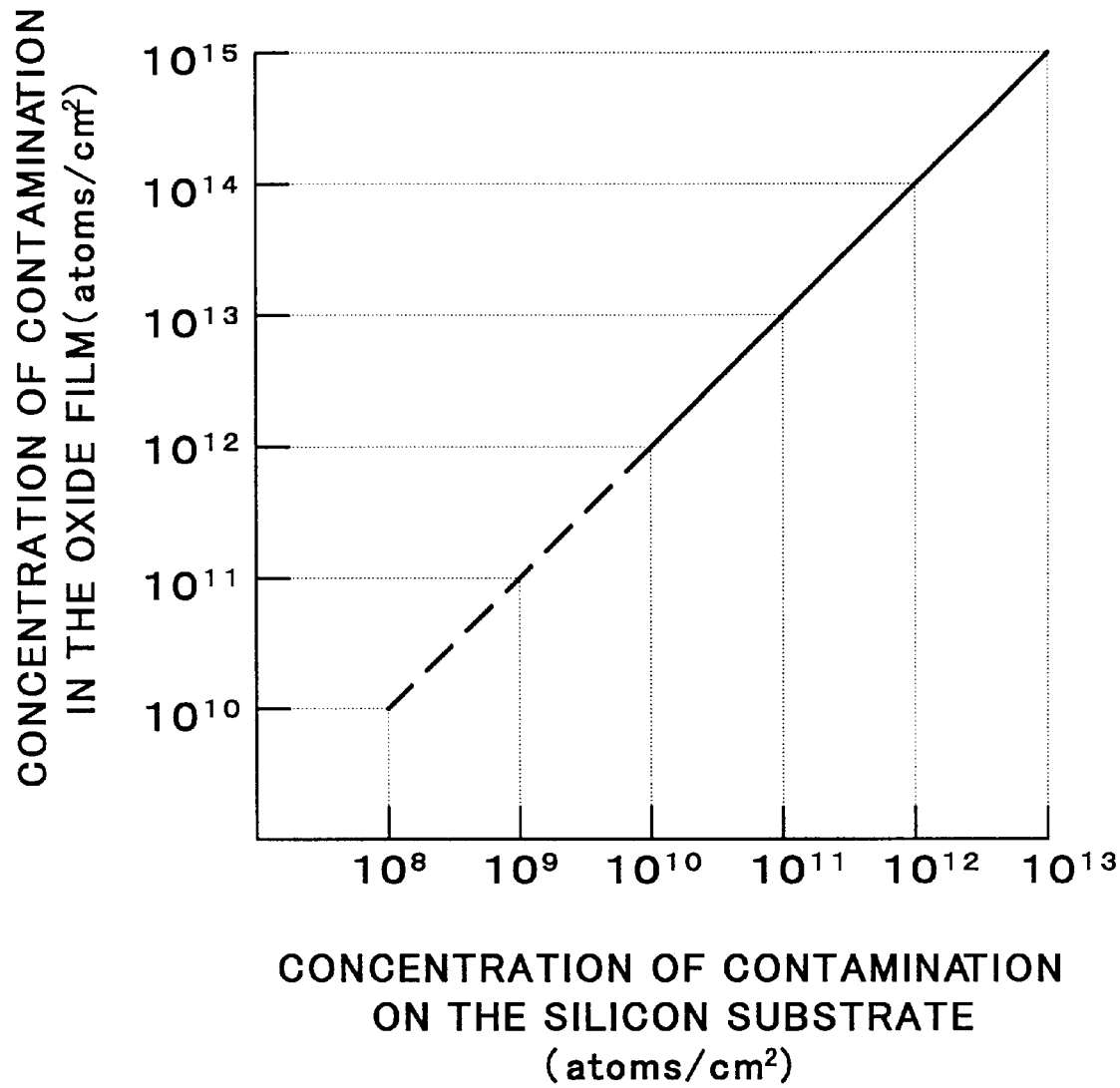
FIG. 8 is a graph which shows the relation between the concentration of contamination on the silicon substrate and that of the oxide film

10) The above steps 1–9 are repeated while varying the cleaning time, The concentration of contamination on the silicon substrate and that of the oxide film is obtained in each cleaning times. FIG. 8 is a graph which shows the relation between the concentration of contamination on the silicon substrate and that of the oxide film. As shown in this graph, there is a proportional relation between the concentration of contamination on the silicon substrate and the concentration of contamination in the oxide film regardless of the cleaning time. The graph shows that the oxide film is contaminated about 100 times greater than the silicon substrate. In the range below $10^{10}$ within which it is difficult to detect contamination, the relation is approximated by the dashed straight line shown in this figure. That is, when the concentration of contamination in the oxidation film is $10^{10}$ (atoms/cm$^2$), it is supposed that the concentration of contamination on the silicon substrate is $10^8$ (atoms/cm$^2$).

11) Concentration of contamination on a product wafer which has been cleaned by the cleaning machine is determined by using the graph shown in FIG. 8. Specifically, the value on the horizontal axis in FIG. 8 corresponding to the cleaning time of the product wafer is used to determine the concentration of contamination on the product wafer.

Figure 9:
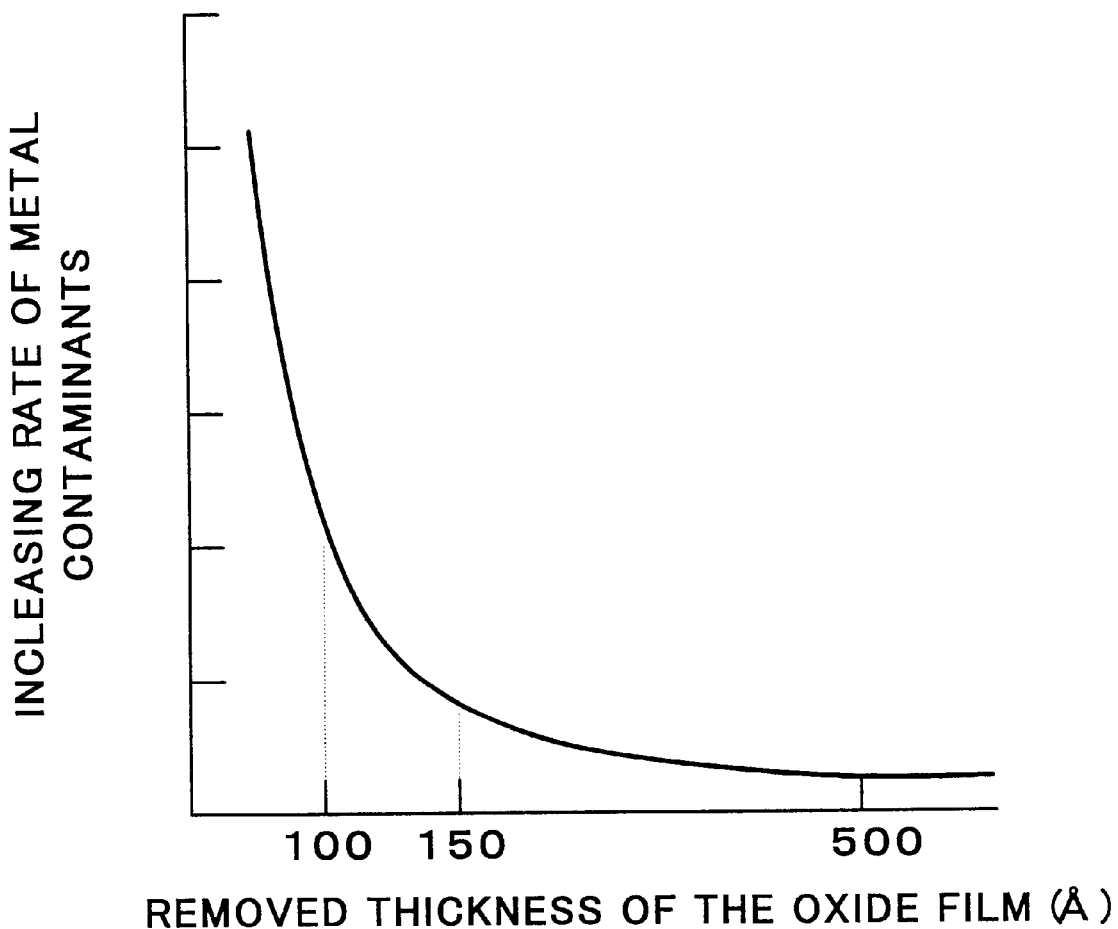
FIG. 9 is a graph which shows the relation between the removed thickness of the oxide film and the increasing rate of the concentration of contamination in the oxide film.

Furthermore, in order to confirm the relation between a collection yield of the contaminants 14 and a removed thickness of the oxide film 10, some values of the concentration of contamination in the oxide film are measured with the removed thickness being varied. FIG. 9 is a graph which shows the relation between the removed thickness of the oxide film and the increasing rate of the concentration of contamination in the oxide film. This figure shows that the thinner the oxide film is, the greater the yield varies. Especially, the yield of the contaminants has hardly changed more than 500 Å. Therefore, the removed thickness of 500 Å or less is preferable, the removed thickness of 150 Å or less is more preferable in order to collect the contaminants efficiently.

This invention may be embodied in other specific forms without departing from the spirit or essential characteristics thereof. The present embodiment is therefore to be considered in all respects as illustrative and not restrictive, the scope of this invention being indicated by the appended claims rather than by the foregoing description and all changes which come within the meaning and range of equivalency of the claims are therefore intended to be embraced therein.

What is claimed is:

1. A method of detecting concentration of contamination on a silicon wafer comprising;

an oxide film forming step of forming an oxide film on at least a part of a silicon substrate;

an oxide film cleaning step of cleaning the oxide film formed on the silicon substrate;

an oxide film collecting step of collecting the oxide film cleaned in the oxide film cleaning step;

an oxide film contamination detecting step of analyzing the oxide film collected in the oxide film collecting step to detect concentration of contamination of the oxide film in the oxide film cleaning step; and a wafer contamination determining step of determining concentration of contamination on the silicon wafer cleaned in same conditions as the oxide film cleaning step based on the concentration of contamination in the oxide film detected in the oxide film contamination detecting step.

2. A method of detecting concentration of contamination on a silicon wafer as claimed in claim 1, wherein the wafer contamination determining step determines the concentration of contamination on the silicon wafer to be one hundredth of the concentration of contamination in the oxide film.

3. A method of detecting concentration of contamination on a silicon wafer as claimed in claim 1, wherein the oxide film collecting step comprises:

a medical fluid dropping step of dropping a medical fluid on the oxide film cleaned in the oxide film cleaning step;

a medical fluid moving step of moving the medical fluid on the oxide film; and a step of collecting the medical fluid after performing the medical fluid moving step.

4. A method of detecting concentration of contamination on a silicon wafer as claimed in claim 3, wherein the medical fluid is selected from a group consisting of HF, HF+HNO$_3$, HF+H$_2$ and HCl+H$_2$O$_2$.

5. A method of detecting concentration of contamination on a silicon wafer as claimed in claim 3, wherein the oxide film collecting step further comprises a gas treating step of treating the oxide film with fluorinated gas before performing the medical fluid dropping step.

6. A method of detecting concentration of contamination on a silicon wafer as claimed in claim 1, wherein the oxide film collecting step removes a thickness of 500 Å or less of the oxide film.

7. A method of detecting concentration of contamination on a silicon wafer as claimed in claim 1, wherein the oxide film collecting step removes a thickness of 150 Å or less of the oxide film.

* * * * *